US011864331B2

(12) United States Patent
Zhu (10) Patent No.: US 11,864,331 B2
(45) Date of Patent: Jan. 2, 2024

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Cuilin Zhu, Wuhan (CN)

( * ) Notice: Subject to any disclaimer, the term of this patent is extended or adjusted under 35 U.S.C. 154(b) by 278 days.

(21) Appl. No.: 17/296,240

(22) PCT Filed: Mar. 30, 2021

(86) PCT No.: PCT/CN2021/083855
§ 371 (c)(1),
(2) Date: May 23, 2021

(87) PCT Pub. No.: WO2022/193360
PCT Pub. Date: Sep. 22, 2022

(65) Prior Publication Data
US 2023/0052602 A1 Feb. 16, 2023

(30) Foreign Application Priority Data

Mar. 15, 2021 (CN) .......................... 202110277308.0

(51) Int. Cl.
*H05K 5/00* (2006.01)
*H05K 5/02* (2006.01)
*G06F 1/16* (2006.01)

(52) U.S. Cl.
CPC ............. *H05K 5/02* (2013.01); *G06F 1/1601* (2013.01); *G06F 1/1626* (2013.01)

(58) Field of Classification Search
CPC ....... H05K 5/02; G06F 1/1601; G06F 1/1626; G06F 1/1652; H10K 77/111; H10K 2102/311; G09F 9/301
USPC ......................................... 361/807
See application file for complete search history.

(56) References Cited

U.S. PATENT DOCUMENTS

| 11,621,308 | B2 * | 4/2023 | Seo | ........................ G06F 3/0412 |
| | | | | 345/174 |
| 2013/0002572 | A1 | 1/2013 | Jin | |
| 2016/0093833 | A1 * | 3/2016 | No | ........................ H10K 50/868 |
| | | | | 438/31 |
| 2019/0108793 | A1 * | 4/2019 | Kim | ........................ G09G 3/3233 |
| 2019/0347989 | A1 * | 11/2019 | Lee | ........................ H01L 27/1218 |
| 2020/0057545 | A1 * | 2/2020 | Seomoon | ............... H05K 1/189 |

(Continued)

FOREIGN PATENT DOCUMENTS

| CN | 109872633 A | 6/2019 |
| CN | 110568966 A | 12/2019 |

(Continued)

*Primary Examiner* — Anatoly Vortman
*Assistant Examiner* — Zhengfu J Feng (57) ABSTRACT

A display panel and a display device are provided. Through setting an area difference between a first sub-display area and a second sub-display area in two directions of the display panel to be less than or equal to a preset value, an area difference between a force-receiving area of the first sub-display area and a force-receiving area of the second sub-display area will be less than or equal to a preset value such that force exerted on the first sub-display area and the second sub-display area is uniform, preventing concentrated force on one side of the display panel from causing the display panel to break.

19 Claims, 6 Drawing Sheets

(56) References Cited

U.S. PATENT DOCUMENTS

| | | | |
|---|---|---|---|
| 2020/0170126 A1* | 5/2020 | Ahn | ............... H10K 59/353 |
| 2020/0185641 A1 | 6/2020 | Jeong | |
| 2021/0191552 A1* | 6/2021 | Bok | ............... G06F 1/1652 |
| 2021/0320275 A1* | 10/2021 | Cho | ............... H10K 77/111 |

FOREIGN PATENT DOCUMENTS

| | | |
|---|---|---|
| CN | 110867472 A | 3/2020 |
| CN | 111430411 A | 7/2020 |
| CN | 111627330 A | 9/2020 |
| CN | 111627332 A | 9/2020 |
| CN | 112116879 A | 12/2020 |
| CN | 112424678 A | 2/2021 |
| WO | 2020218705 A1 | 10/2020 |

* cited by examiner

DISPLAY PANEL AND DISPLAY DEVICE

FIELD OF INVENTION

The present application relates to the field of display technology, and especially to a display panel and a display device.

BACKGROUND OF INVENTION

In conventional display devices, in order to increase a screen-to-body ratio of display devices and realize full screen, corresponding designs are applied to the display devices. In a development course of full-screen display devices, a display device that can display on four side surfaces is designed in the conventional display devices, allowing the four side surfaces of the display device to display. However, in display devices with side surface display, stress exerted on each side of a display panel is not uniform, leaving one side of the display panel susceptible to breakage, and black spots or black lines occur during a reliability test of the display device, and consequently the display panel cannot be normally used.

Therefore, a technical problem that non-uniform stress exerted on each side leads to display device breaking exists in conventional display devices with side surface display.

SUMMARY OF INVENTION

Embodiments of the present application provide a display panel and a display device to solve a technical problem existing in conventional display devices with side surface display that non-uniform stress exerted on each side leads to display device breaking.

For solving the above-described problem, technical approach provide by the present application is as follows:

Embodiments of the present application provide a display panel that includes a main display area; a sub-display area disposed around the main display area; and a terminal area disposed on one side of the sub-display area away from the main display area; wherein the sub-display area comprises a first sub-display area and a second sub-display area adjacent to the main display area in a first direction and a second direction, respectively, the first direction is different from the second direction, and a difference between an area of the first sub-display area and an area of the second sub-display area is less than or equal to a preset value.

In one embodiment, the main display area includes a first side in contact with the first sub-display area in the first direction and a second side in contact with the second sub-display area in the second direction, the first side and the second side meet and form a corner, and a shape of the corner is an arc.

In one embodiment, in a plane projection, a shape of the first sub-display area and the second sub-display area is rectangular, and an area of the first sub-display area and the second sub-display area is equal.

In one embodiment, a length of the first sub-display area is less than a length of the second sub-display area, and a width of the first sub-display area is greater than a width of the second sub-display area.

In one embodiment, the main display area includes a first side in contact with the first sub-display area in the first direction and a second side in contact with the second sub-display area in the second direction, the first side and the second side meet and form a corner, and a shape of the corner is a rectilinear angle.

In one embodiment, a shape of the first sub-display area and the second sub-display area is trapezoid-like, two sides of the first sub-display area and the second sub-display area are an arc, and an area of the first sub-display area and the second sub-display area is equal.

In one embodiment, a width of the first sub-display area in the first direction is less than a width of the second sub-display area in the second direction.

In one embodiment, in a vertical projection direction, a thickness of the display panel at the first sub-display area is equal to a thickness of the display panel at the second sub-display area.

In one embodiment, a range of a bending angle of the first sub-display area of the display panel is 45 degrees to 90 degrees, and a range of a bending angle of the second sub-display area of the display panel is 45 degrees to 90 degrees.

In one embodiment, a curvature of the display panel at the first sub-display area is equal to a curvature of the display panel at the second sub-display area.

In one embodiment, the display panel includes a substrate; a driving circuit layer disposed on one side of the substrate; a luminous functional layer disposed on one side of the driving circuit layer away from the substrate; an encapsulation layer disposed on one side of the luminous functional layer away from the driving circuit layer; and a polarizer disposed on one side of the encapsulation layer away from the luminous functional layer; wherein the polarizer includes a first polarizer part disposed at the first sub-display area and a second polarizer part disposed at the second sub-display area, and a difference between an area of the first polarizer part and an area of the second polarizer part is less than or equal to the preset value.

In one embodiment, the display panel further includes a backplate, the backplate is disposed on one side of the substrate away from the driving circuit layer, the backplate includes a first backplate part disposed at the first sub-display area and a second backplate part disposed at the second sub-display area, and a difference between an area of the first backplate part and an area of the second backplate part is less than or equal to the preset value.

In one embodiment, the display panel further includes a cover plate, the cover plate is disposed on one side of the polarizer away from the encapsulation layer, and a surface area of the cover plate is greater than a surface area of the polarizer.

Meanwhile, embodiments of the present application provide a display device that includes a display panel comprising a main display area, a sub-display area, and a terminal area, wherein the sub-display area is disposed around the main display area, and the terminal area is disposed on one side of the sub-display area away from the main display area, and wherein the sub-display area includes a first sub-display area and a second sub-display area adjacent to the main display area in a first direction and a second direction, respectively, the first direction is different from the second direction, and a difference between an area of the first sub-display area and an area of the second sub-display area is less than or equal to a preset value.

In one embodiment, the main display area includes a first side in contact with the first sub-display area in the first direction and a second side in contact with the second sub-display area in the second direction, the first side and the second side meet and form a corner, and a shape of the corner is an arc.

In one embodiment, in a plane projection, a shape of the first sub-display area and the second sub-display area is rectangular, and an area of the first sub-display area and the second sub-display area is equal.

In one embodiment, a length of the first sub-display area is less than a length of the second sub-display area, and a width of the first sub-display area is greater than a width of the second sub-display area.

In one embodiment, the main display area includes a first side in contact with the first sub-display area in the first direction and a second side in contact with the second sub-display area in the second direction, the first side and the second side meet and form a corner, and a shape of the corner is a rectilinear angle.

In one embodiment, a shape of the first sub-display area and the second sub-display area is trapezoid-like, two sides of the first sub-display area and the second sub-display area are an arc, and an area of the first sub-display area and the second sub-display area is equal.

In one embodiment, a width of the first sub-display area in the first direction is less than a width of the second sub-display area in the second direction.

The present application provides a display panel and a display device. The display panel includes a main display area, a sub-display area, and a terminal area. The sub-display area is disposed around the main display area, and the terminal area is disposed on one side of the sub-display area away from the main display area. Wherein, the sub-display area includes a first sub-display area and a second sub-display area adjacent to the main display area in a first direction and a second direction, respectively, the first direction is different from the second direction, and a difference between an area of the first sub-display area and an area of the second sub-display area is less than or equal to a preset value. In the present application, through setting an area difference between the first sub-display area and the second sub-display area in two directions of the display panel to be less than or equal to a preset value, an area difference between a force-receiving area of the first sub-display area and a force-receiving area of the second sub-display area will be less than or equal to a preset value such that force exerted on the first sub-display area and the second sub-display area is uniform, preventing concentrated force on one side of the display panel from causing the display panel to break, and increasing yields of the display panel.

DESCRIPTION OF DRAWINGS

With reference to the following drawings, the technical approach and other beneficial effects of the present application will be obvious through describing embodiments of the present application in detail.

DETAILED DESCRIPTION OF EMBODIMENTS

For better clearness and definiteness of purpose, technical approach, and effect of the present application, the following further describes embodiments of the present application in detail with reference to accompanying drawings. It should be understood that the embodiments described here is merely for explaining the present application and not intended to limit the present application.

Embodiments of the present application direct to a technical problem existing in conventional display devices with side surface display that non-uniform stress exerted on each side leads to display device breaking, and the present application can solve the technical problem.

Figure 1:
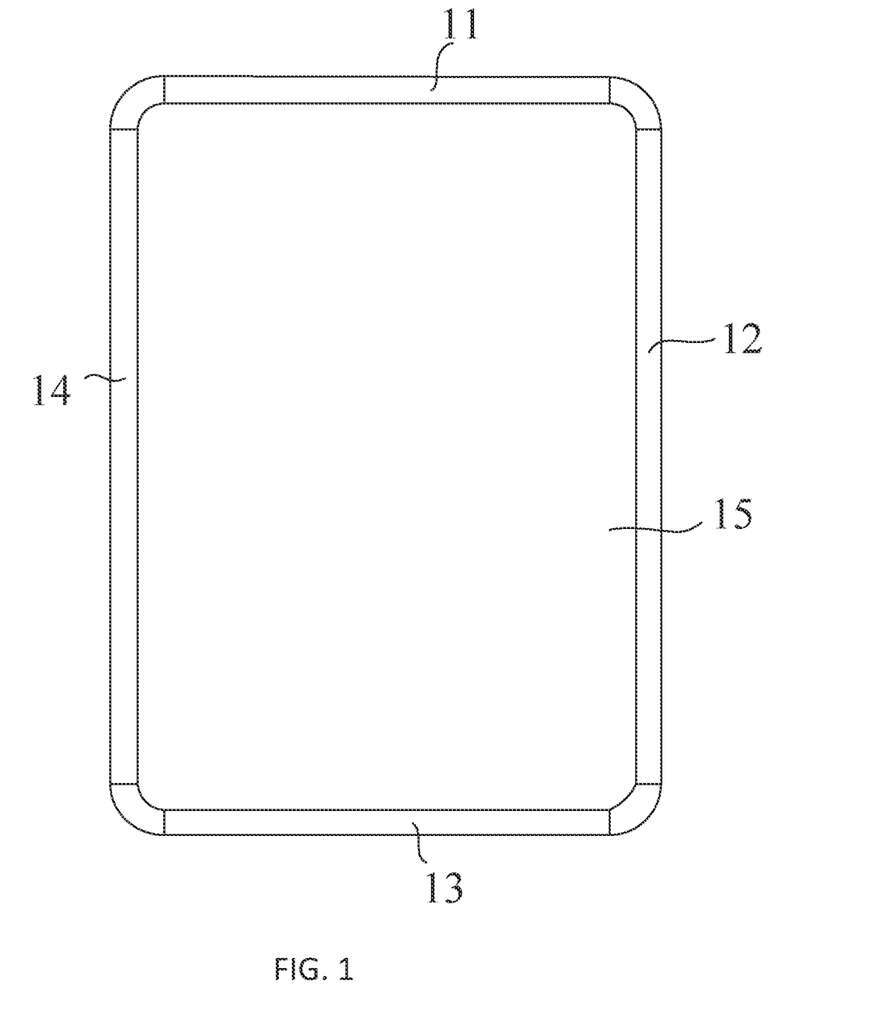
FIG. 1 is a structural schematic diagram of a conventional display device.
Figure 2:
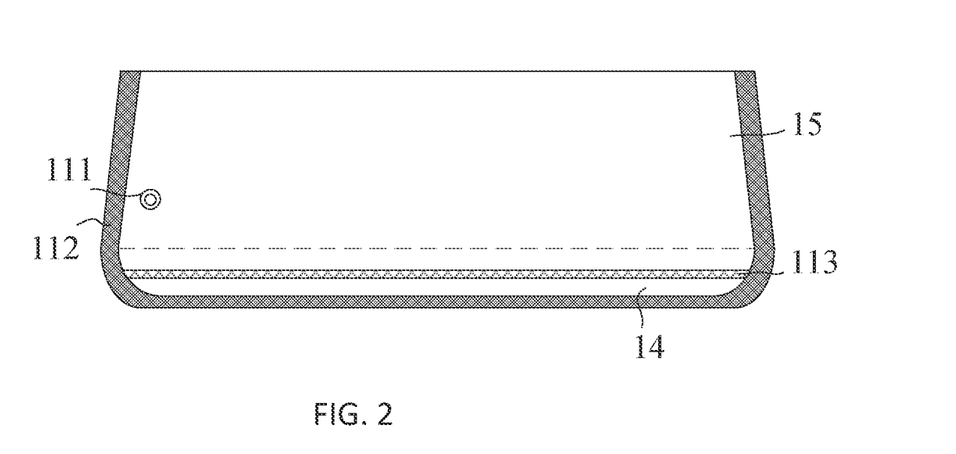
FIG. 2 is a schematic diagram of a broken display panel in a conventional display device.

As shown in FIG. 1, in order to increase a screen-to-body ratio and display area, a display panel is bent to a rear side in conventional display devices, forming a camber on four side surfaces of the display panel such that a front surface of the display panel as well as four curved surfaces of the display panel can display, thereby increasing display area and a screen-to-body ratio of the display panel. That is, an upper side curved surface display area 11, a right side curved surface display area 12, a lower side curved surface display area 13, a left side curved surface display area 14, and a front surface planar display area 15 in FIG. 1 can all display. However, during course of a reliability test of the display panel, non-uniform force exerted on each side of the display panel will lead to breakage on sides of the display panel. As shown in FIG. 2, the display panel includes an electronic component disposing area 111, a border line 112, and a breaking line 113. That is, the breaking line 113 will occur in the left side curved surface display area 14 of the display panel, leading to a dark line of the display panel when displaying. Meanwhile, problems such as black spots also occur during a reliability test, such that the display panel is unable to normally display, leading to defective display panels, i.e., a technical problem that non-uniform stress exerted on each side of the display panel leads to display device breaking exists in conventional display devices having side surface display.

Figure 3:
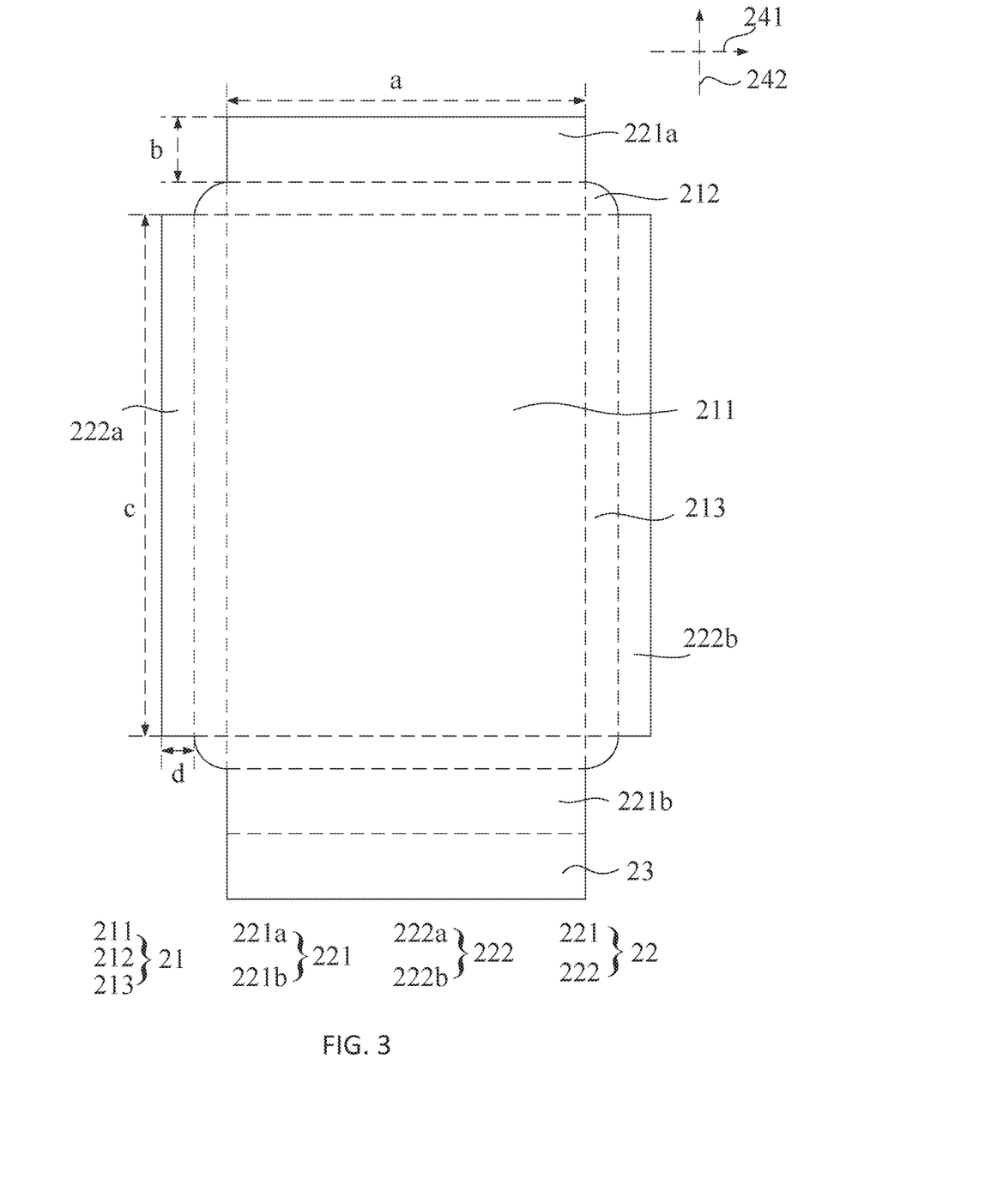
FIG. 3 is a first schematic diagram of a display panel according to an embodiment of the present application.

As shown in FIG. 3, embodiments of the present application provide a display panel that includes:

A main display area 21;

A sub-display area 22 disposed around the main display area 21;

A terminal area 23 disposed on one side of the sub-display area 22 away from the main display area 21;

Wherein, the sub-display area 22 includes a first sub-display area 221 and a second sub-display area 222 adjacent to the main display area 21 in a first direction 241 and a second direction 242, respectively, the first direction 241 is different from the second direction 242, and a difference between an area $a*b$ of the first sub-display area 221 and an area $c*d$ of the second sub-display area 222 is less than or equal to a preset value k, i.e., $(a*b-c*d) \leq k$.

Embodiments of the present application provide a display panel. Through setting an area difference between the first sub-display area and the second sub-display area in two directions of the display panel to be less than or equal to a preset value, an area difference between a force-receiving area of the first sub-display area and a force-receiving area of the second sub-display area will be less than or equal to a preset value such that force exerted on the first sub-display area and the second sub-display area is uniform, preventing concentrated force on one side of the display panel from causing the display panel to break and increasing yield of the display panel.

It should be explained that, in embodiments of the present application, a preset value is decided according to a principle that stress exerted on each laminating area of the display panel can be uniform. For example, when an area difference between the first sub-display area and the second sub-display area is less than one square millimeter, stress on the first sub-display area and the second sub-display area is uniform, or a relative stress-concentrated area of the first sub-display area and the second sub-display area would not lead to the display panel breaking, then the preset value is one square millimeter.

It should be explained that when a difference between an area of the first sub-display area and an area of the second sub-display area is less than 0, the preset value is negative. However, for clearer description of the area difference between the first sub-display area and the second sub-display area, the area difference between the first sub-display area and the second sub-display area is limited to be positive in the present application, and the preset value is greater than or equal to 0.

It should be explained that an area of the first sub-display area and an area of the second sub-display area mean an area projected on a display interface corresponding to the main display area, i.e., an area of the first sub-display area and an area of the second sub-display area are plane areas, such as an area projected on a plane of the display panel shown in FIG. 3.

In one embodiment, the first direction is perpendicular to the second direction. During a course of designing the display panel, the display panel is designed to be a rectangle or rectangle-like. That is, the first direction is perpendicular to the second direction, such that the first sub-display area and the second sub-display area in the two directions perpendicular to each other have a same area, preventing non-uniform force exerted on sides of the display panel leading to display panel breaking.

In one embodiment, as shown in FIG. 3, the main display area 21 includes a planar display area 211, a corner display area 213, and a side surface display area 212. Wherein, when the display panel is bent to have four curved surfaces, the side surface display area 212 curves.

In one embodiment, as shown in FIG. 3, the main display area 21 includes a first side in contact with the first sub-display area 221 in the first direction 241 and a second side in contact with the second sub-display area 222 in the second direction 242, the first side and the second side meet and form a corner, and a shape of the corner is an arc (arc here means a shape of the main display area 21 at the corner is an arc as shown in FIG. 3, such as a circular arc, elliptic arc, etc.) With a display panel adopting an arc corner to form four curved surfaces, through setting a difference between an area of the first sub-display area in the first direction and an area of the second sub-display area in the second direction to be less than or equal to a preset value, concentrated force on one side of the display panel that leads to display panel breaking is prevented, increasing yields of the display panel.

In embodiments of the present application, a shape and a length of an arc of the arc corner can be designed according to requirements.

In one embodiment, as shown in FIG. 3, a shape of the first sub-display area and the second sub-display area is rectangular, and an area a*b of the first sub-display area 221 and an area c*d of the second sub-display area are equal, i.e., a*b=c*d. With a display panel realizing a four-curved-surface design through a round corner (specifically an R corner), through making an area of the first sub-display area and the second sub-display area that form the four curved surfaces of the display panel be equal, an area of force-receiving area of the first sub-display area is equal to an area of force-receiving area of the second sub-display area, such that force exerted on the first sub-display area and the second sub-display area is uniform, preventing non-uniform force exerted on the display panel leading to display panel breaking.

In one embodiment, as shown in FIG. 3, the first sub-display area 221 includes a first upper sub-display area 221a and a first lower sub-display area 221b disposed oppositely, and an area of the first upper sub-display area 221a and an area of the first lower sub-display area 221b are equal. When the first sub-display area of the display panel includes the first upper sub-display area located on an upper side of the display panel and the first lower sub-display area located on a lower side of the display panel, an area of the first upper sub-display area and the first lower sub-display area can be equal, such that an area difference between the first upper sub-display area and one second sub-display area is less than a preset value, and an area difference between the first lower sub-display area and another second sub-display area is less than a preset value. In this way, stress exerted on at least one second sub-display area, the first upper sub-display area, and the first lower sub-display area is uniform, thereby preventing display panel from breaking at at least one second sub-display area, the first upper sub-display area, and the first lower sub-display area, and increasing yields of the display panel.

In one embodiment, as shown in FIG. 3, the second sub-display area 222 includes a second left sub-display area 222a and a second right sub-display area 222b oppositely disposed, and an area of the second left sub-display area 222a and the second right sub-display area 222b is equal. When the second sub-display area of the display panel includes the second left sub-display area and the second right sub-display area, an area of the second left sub-display area and an area of the second right sub-display area can be equal, such that an area difference between the second left sub-display area and at least one first sub-display area is less than a preset value, and an area difference between the second right sub-display area and at least one first sub-display area is less than a preset value. In this way, stress exerted on the second left sub-display area, the second right sub-display area, and at least one first sub-display area is uniform, thereby preventing display panel breaking at at least one of first sub-display area, the second left sub-display area, or the second right sub-display area, and increasing yields of the display panel.

It should be explained that, in the above-described embodiment, the first upper sub-display area is located at an upper area of the display panel, but in embodiments of the present application, the first upper sub-display area is not limited to be located at an upper side of the display panel, and the first upper sub-display area can also be located at an area between the main display area and the terminal area. Similarly, the first lower sub-display area, the second left sub-display area, and the second right sub-display area are also not limited to a lower side area, a left side area, and a right side area of the display panel. In one embodiment, the first sub-display area includes the first upper sub-display area and the first lower sub-display area disposed oppositely, the second sub-display area includes the second left sub-display area and the second right sub-display area disposed oppositely, and an area of the first upper sub-display area, the first lower sub-display area, the second left sub-display area, and the second right sub-display area is equal. Considering uniformity of stress exerted on each sub-display area, the area of the sub-display areas located on four sides of the display panel can be equal, such that stress exerted on each sub-display area of the display panel is equal, and force exerted on each sub-display area of the display panel is uniform, thereby preventing a problem of display panel breaking due to relatively concentrated stress and increasing yields of the display panel.

In one embodiment, the first upper sub-display area is disposed on one side of the main display area away from the terminal area, and an area difference between the first upper sub-display area and the second left sub-display area is less than or equal to a preset value, and therefore stress exerted on the first upper sub-display area and the second left sub-display area of the display panel is close or even equal, thereby making stress exerted on the first upper sub-display area and the second left sub-display area of the display panel uniform and preventing the display panel breaking at the first upper sub-display area and the second left sub-display area due to concentrated stress.

In one embodiment, the first upper sub-display area is disposed on one side of the main display area away from the terminal area, and an area difference between the first upper sub-display area and the second right sub-display area is less than or equal to a preset value, and therefore stress exerted on the first upper sub-display area and the second right sub-display area of the display panel is close or even equal, thereby making stress exerted on the first upper sub-display area and the second right sub-display area of the display panel be uniform, and preventing display panel breaking at the first upper sub-display area and the second right sub-display area due to concentrated stress.

In one embodiment, the first lower sub-display area is disposed between the main display area and the terminal area, and an area difference between the first lower sub-display area and the second left sub-display area is less than or equal to a preset value. Through making the area difference between the first lower sub-display area and the second left sub-display area be less than or equal to the preset value, stress exerted on the first lower sub-display area and the second left sub-display area of the display panel is close or even equal, thereby making stress exerted on the first lower sub-display area and the second left sub-display area of the display panel be uniform and preventing display panel breaking at the first lower sub-display area and the second left sub-display area due to concentrated stress.

In one embodiment, the first lower sub-display area is disposed between the main display area and the terminal area, and an area difference between the first lower sub-display area and the second right sub-display area is less than or equal a preset value. Through making the area difference between the first lower sub-display area and the second right sub-display area be less than or equal to the preset value, stress exerted on the first lower sub-display area and the second right sub-display area of the display panel is uniform, thereby preventing display panel breaking at the first lower sub-display area and the second right sub-display area of the display panel due to concentrated stress.

In one embodiment, a shape of the first upper sub-display area, the first lower sub-display area, the second left sub-display area, and the second right sub-display area includes a rectangle.

In one embodiment, a length of the first sub-display area is less than a length of the second sub-display area, and a width of the first sub-display area is greater than a width of the second sub-display area. When a shape of the display panel is rectangular, a length of two adjacent sides of the display panel is not equal. That is, the length of the first sub-display area is less than the length of the second sub-display area, corresponding making the width of the first sub-display area be greater than the width of the second sub-display area, such that an area of the first sub-display area is equal to an area of the second sub-display area, preventing display panel breaking due to non-uniform force exerted on sides of the display panel.

In one embodiment, as shown in FIG. 3, a width b of the first upper sub-display area 221a is greater than a width d of the second left sub-display area 222a, a length a of the first upper sub-display area 221a is less than a length c of the second left sub-display area 222a, and a difference between an area of the first upper sub-display area and an area of the second left sub-display area is less than or equal to a preset value. That is, when a plane projection of the display device is designed to be rectangular, the length of the second left sub-display area can be greater than the length of the first upper sub-display area, and the width of the first upper sub-display area is greater than the width d of the second left sub-display area, such that the area difference between the first upper sub-display area and the second left sub-display area is less than or equal to the preset value, thereby preventing display panel breaking due to concentrated stress, while having a required shape design of the display panel.

In one embodiment, the width of the first upper sub-display area can also be less than the width of the second left sub-display area, the length of the first upper sub-display area is greater than the length of the second left sub-display area, and a difference between the area of the first upper sub-display area and the area of the second left sub-display area is less than or equal to a preset value. For a display panel with the terminal area disposed at the second left sub-display area or the second right sub-display area away from the main display area, the length of the first upper sub-display area is greater than the length of the second left sub-display area, and the width of the first upper sub-display area is less than the width of the second left sub-display area, such that the area of the first upper sub-display area and the area of the second left sub-display area is close or even equal, thereby preventing display panel breaking due to concentrated stress, while having a required shape design of the display panel.

In one embodiment, the width of the first upper sub-display area is equal to the width of the second left sub-display area, and the length of the first upper sub-display area is equal to the length of the second left sub-display area. That is, an area of four laminating areas located on sides of the display panel is equal, and the length and the width are equal, such that stress exerted on four laminating areas located on sides of the display panel is equal, and stress exerted on each laminating area of the display panel is uniform, thereby preventing display panel breaking due to concentrated stress.

It should be explained that, in embodiments of the present application, a width is a shorter side of a rectangle, and a length is a longer side of the rectangle. As in FIG. 3, a>b and c>d, so b and d are widths, and a and c are lengths. When a rectangle is a square, a length and a width of the rectangle can be arbitrarily defined.

Figure 4:
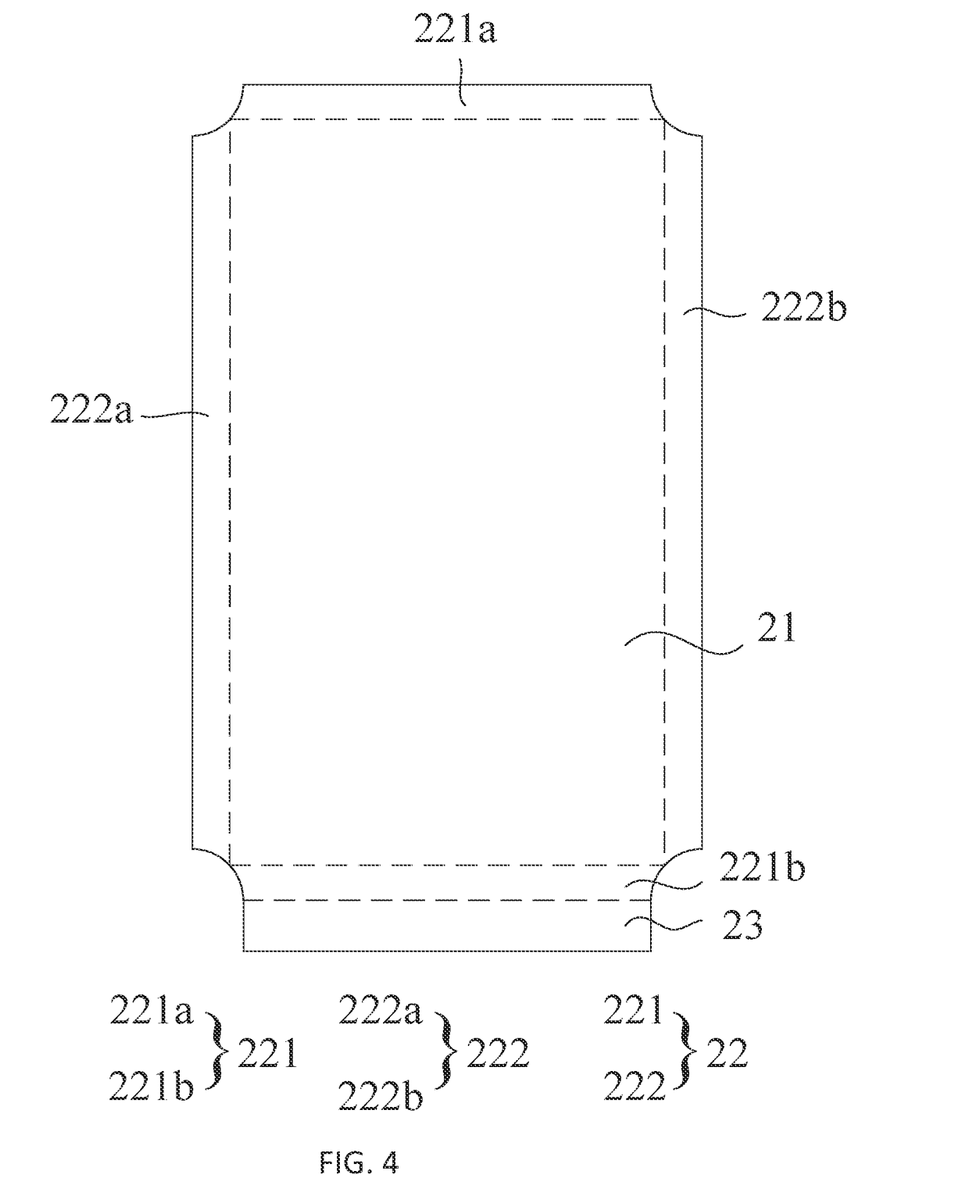
FIG. 4 is a second schematic diagram of the display panel according to an embodiment of the present application.

In one embodiment, as shown in FIG. 4, the main display area 21 includes a first side in contact with the first sub-display area 221 in the first direction 241 and a second side in contact with the second sub-display area 222 in the second direction 242, the first side and the second side meet and form a corner, and a shape of the corner is a rectilinear angle (rectilinear angle here means a shape of the main display area 21 at the corner is an rectilinear angle as shown in FIG. 4, such as a right angle, an acute angle, an obtuse angle, etc.)

With a display panel adopting a rectilinear angle to form four curved surfaces, through setting a difference between an area of the first sub-display area in the first direction and an area of the second sub-display area in the second direction to be less than or equal to a preset value, concentrated force on one side of the display panel that leads to display panel breaking is prevented, increasing yields of the display panel.

In one embodiment, as shown in FIG. 4, a shape of the first sub-display area 221 and the second sub-display 222 area is trapezoid-like (trapezoid-like shape here means, as shown in FIG. 4, the shape of the first sub-display area 221 and the second sub-display area 222 is formed by straight lines of different lengths and arcs, e.g., upper and lower lines in FIG. 4 are straight lines and parallel, and the other sides are arcs.) Two sides of the first sub-display area 221 and the second sub-display area 222 are an arc, and an area of the first sub-display area 221 and the second sub-display area 222 is equal. With a display panel realizing a four-curved-surface design through two sub-display areas forming arcs, through making an area of the first sub-display area and the second sub-display area be equal, an area of force-receiving area of the first sub-display area is equal to an area of force-receiving area of the second sub-display area, such that force exerted on the first sub-display area and the second sub-display area is uniform, preventing non-uniform force exerted on the display panel leading to display panel breaking. When the display panel is bent to form the four curved surfaces, it is bent to its rear side to form a four-curved-surface display panel by using an intersection of the first sub-display area and the second sub-display area with respect to the first side and the second side as a vertex.

In one embodiment, a width of the first sub-display area in the first direction is less than a width of the second sub-display area in the second direction. When an area of the first sub-display area and the second sub-display area is designed to be equal, the width of the first sub-display area can be less than the width of the second sub-display area, and a length of the first sub-display area is greater than a length of the second sub-display area.

In one embodiment, in a vertical projection direction, a thickness of the display panel at the first sub-display area is equal to a thickness of the display panel at the second sub-display area. When controlling an area of the sub-display areas to make force exerted on each sub-display area of the display panel be uniform, the thickness of the display panel at the first sub-display area can also be equal to the thickness of the display panel at the second sub-display area, such that internal stress of the display panel at the first sub-display area is equal to internal stress of the display panel at the second sub-display area, thereby preventing non-uniform stress of the display panel at different sub-display areas that leads to display panel breaking.

In one embodiment, a range of a bending angle of the first sub-display area is 45 degrees to 90 degrees, and a range of a bending angle of the second sub-display area of the display panel is 45 degrees to 90 degrees. Through limiting the bending angle of the display panel to 45 degrees to 90 degrees, bending stress of the display panel would not be excessively high, preventing higher stress of the display panel that causes cracks or breaking.

In one embodiment, a curvature of the display panel at the first sub-display area is equal to a curvature of the display panel at the second sub-display area. After the display panel is bent, through making the curvature of the display panel at the first sub-display area be equal to the curvature of the display panel at the second sub-display area, when the display panel is laminated to a cover plate, stress exerted on the first sub-display area of the display panel and the second sub-display area of the display panel is close or even equal, such that force exerted on the display panel at the first sub-display area and the second sub-display area is uniform, thereby preventing concentrated force on one side of the display panel that leads to display panel breaking, increasing yields of the display device.

In one embodiment, the display panel includes a substrate, a driving circuit layer, a luminous functional layer, an encapsulation layer, and a polarizer. Wherein, the polarizer includes a first polarizer part disposed at the first sub-display area and a second polarizer part disposed at the second sub-display area, and a difference between an area of the first polarizer part and an area of the second polarizer part is less than or equal to the preset value. That is, when disposing the polarizer, dimensions of the polarizer are equal to dimensions of the display panel, such that stress exerted on the polarizer is uniform, and dimensions of the polarizer are equal to dimensions of other film layers of the display panel. In this way, when a cover plate is laminated to the display panel, stress exerted on other film layers of the display panel and the polarizer is equal, thereby preventing concentrated stress on the display panel and the polarizer that leads to breaking and increasing yields of the display panel.

In one embodiment, a curvature of the first polarizer part located at the first sub-display area and a curvature of the second polarizer part disposed at the second sub-display area are equal. When a curvature of the polarizer at each sub-display area is equal, force of the polarizer exerted on each film layer of the display panel is equal, such that force exerted on various areas of the display panel is uniform, preventing display panel breaking due to non-uniform force exerted on the display panel.

In one embodiment, the display panel further includes a backplate. The backplate is disposed on one side of the substrate away from the driving circuit layer, the backplate includes a first backplate part disposed at the first sub-display area and a second backplate part disposed at the second sub-display area, and a difference between an area of the first backplate part and an area of the second backplate part is less than or equal to the preset value. When the backplate is laminated to the substrate, dimensions of the backplate are equal to dimensions of other film layers of the display panel, such that during a course of lamination of the substrate and the backplate of the display panel, stress exerted on the first sub-display area and the second sub-display area of the display panel is close or even equal. Meanwhile, stress exerted on a part of the backplate at the first sub-display area and the second sub-display area is close or even equal, thereby preventing display panel breaking and increasing yields of the display device.

In one embodiment, a curvature of the first backplate part disposed at the first sub-display area and the second backplate part disposed at the second sub-display area is equal. When a curvature of the backplate at each sub-display area is equal, force of the backplate exerted on various film layers of the display panel is equal, such that force exerted on various areas of the display panel is uniform, preventing display panel breaking due to non-uniform force exerted on the display panel.

In one embodiment, the display panel further includes optical adhesive. The optical adhesive is disposed on one side of the polarizer away from the backplate, the optical adhesive includes a first optical adhesive part disposed at the first sub-display area and a second optical adhesive part disposed at the second sub-display area, and a difference between an area of the first optical adhesive part and an area of the second optical adhesive part is less than or equal to a preset value. When other film layers of the display panel are laminated to the cover plate through the optical adhesive, the optical adhesive can have corresponding design such that dimensions of the optical adhesive are equal to dimensions of other film layers of the display panel. Thereby, when the cover plate is laminated to other film layers of the display panel, stress exerted on the first sub-display area and the second sub-display area of the display panel is close or even equal, and stress exerted on the optical adhesive is uniform, thereby preventing display panel breaking.

In one embodiment, a curvature of the first optical adhesive part disposed at the first sub-display area and a curvature of the second optical adhesive part disposed at the second sub-display area are equal. When a curvature of the optical adhesive at each sub-display area is equal, force of the optical adhesive exerted on various film layers of the display panel is equal, such that force exerted on various areas of the display panel is uniform, preventing display panel breaking due to non-uniform force exerted on the display panel.

In one embodiment, the display panel further includes optical adhesive. The optical adhesive is disposed on one side of the polarizer away from the backplate, the optical adhesive includes a first optical adhesive part disposed at the first sub-display area and a second optical adhesive part disposed at the second sub-display area, and a difference between an area of the first optical adhesive part and an area of the second optical adhesive part is greater than a preset value. With optical adhesive being a soft material, when the optical adhesive laminates the cover plate and other film layers of the display panel, it does not affect stress exerted on the display panel or has a minor effect on stress exerted on the display panel, so when designing the optical adhesive, its dimensions does not need to be designed to be equal to dimensions of other film layers of the display panel, and the dimensions of the optical adhesive are designed to be greater than dimensions of other film layers of the display panel, such that the optical adhesive can better laminate the cover plate and the display panel, preventing smaller area of the optical adhesive cannot completely and better laminate the cover plate and the display panel.

Figure 6:
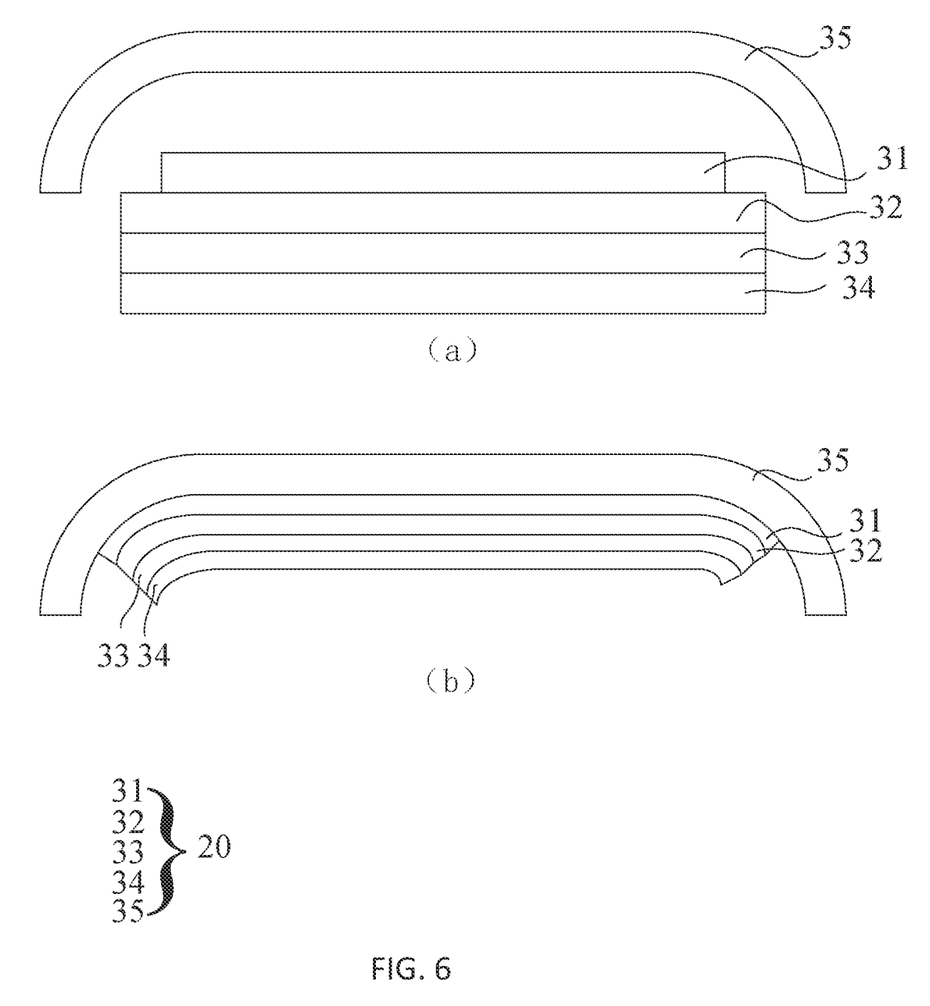
FIG. 6 is a second schematic diagram of the display device according to an embodiment of the present application.

In one embodiment, as shown in FIG. 6, the display panel further includes a cover plate 35, the cover plate 35 is disposed on one side of the polarizer away from the encapsulation layer, and a surface area of the cover plate 35 is greater than a surface area of the polarizer.

Meanwhile, embodiments of the present application provide a display device that includes the display panel according to any one of the above-described embodiments.

Figure 5:
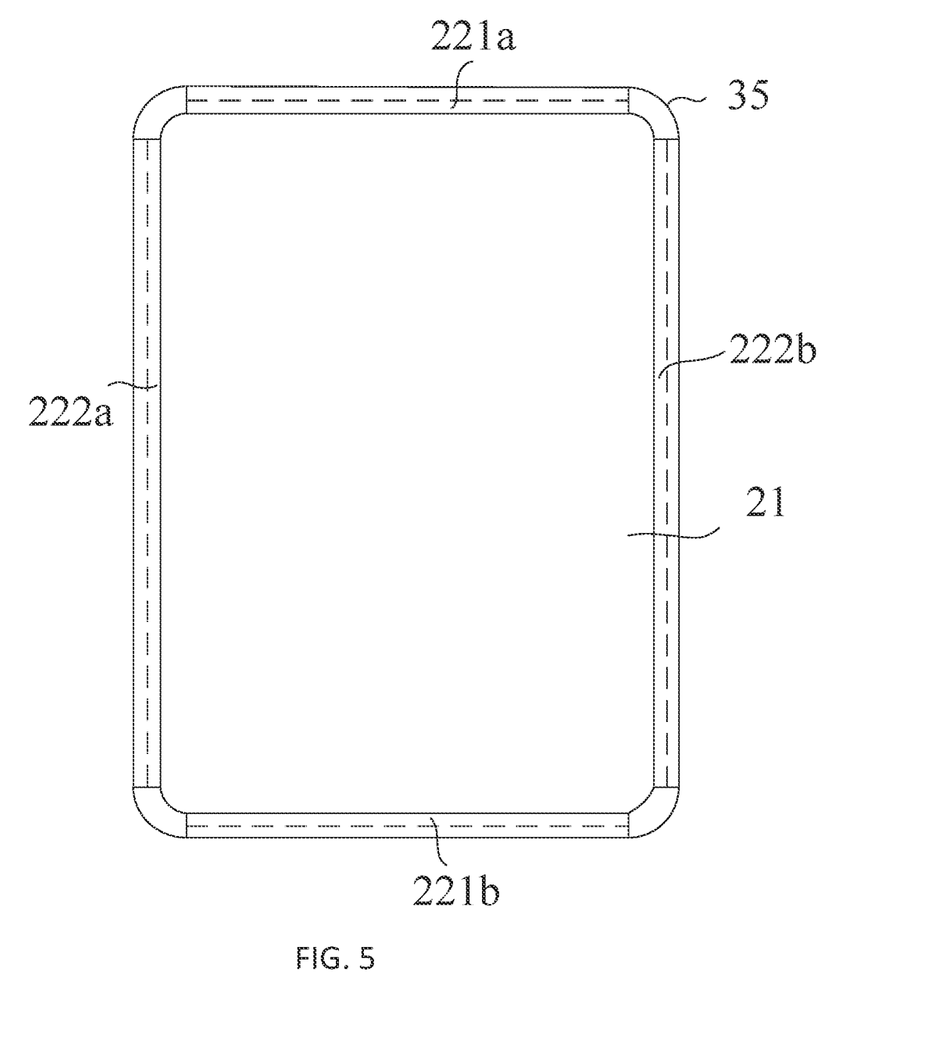
FIG. 5 is a first schematic diagram of a display device according to an embodiment of the present application.

As shown in FIG. 3, FIG. 5, and FIG. 6, embodiments of the present application provide a display device that includes:

A display panel 20 including a main display area 21, a sub-display area 22, and a terminal area 23. The sub-display area 22 is disposed around the main display area 21, the terminal area 23 is disposed on one side of the sub-display area 22 away from the main display area 21. Wherein, the sub-display area 22 includes a first sub-display area 221 and a second sub-display area 222 adjacent to the main display area 21 in a first direction 241 and a second direction 242, respectively, the first direction 241 is different from the second direction 242, and a difference between an area a*b of the first sub-display area 221 and an area c*d of the second sub-display area 222 is less than or equal to a preset value k, i.e., (a*b−c*d)≤k.

Embodiments of the present application provide a display device. Through setting an area difference between the first sub-display area and the second sub-display area in two directions of the display panel in the display device to be less than or equal to a preset value, an area difference between a force-receiving area of the first sub-display area and a force-receiving area of the second sub-display area will be less than or equal to a preset value such that force exerted on the first sub-display area and the second sub-display area is uniform, preventing concentrated force on one side of the display panel that leads to display panel breaking, and increasing yields of the display panel.

As shown in FIG. 6 (*a*), before other film layers of the display panel are laminated to the cover plate 40, dimensions of the backplate 34, the luminous functional layer 33, and the polarizer 32 of the display panel are equal, and a cross sectional area of the polarizer 32 is greater than a cross sectional area of the optical adhesive 31. As shown in FIG. 6 (*b*), after other film layers of the display panel are laminated to the cover plate 40, the display panel 20 is correspondingly curved to form four curved surfaces, and through making an area of each sub-display area be equal in the present application, force exerted on various areas is uniform.

It should be explained that, in embodiments of the present application, because the terminal area is not laminated to the cover plate, an area of the terminal area does not need to be specifically designed. However, with different areas of the sub-display areas, when the area of the terminal area is required to be changed to adapt a design structure or a design space of the display panel, the area of the terminal area can be correspondingly modified, and embodiments of the present application do not limit here. When the terminal area is laminated to the cover plate in a display device, the terminal area can be designed according to design of the sub-display areas of the present application, such that stress exerted on various areas of the display panel is uniform, thereby preventing display panel breaking due to uniform stress.

In one embodiment, in the display device, the main display area includes a first side in contact with the first sub-display area in the first direction and a second side in contact with the second sub-display area in the second direction, the first side and the second side meet and form a corner, and a shape of the corner is an arc.

In one embodiment, in the display device, in a plane projection, a shape of the first sub-display area and a shape of the second sub-display area are rectangular, and an area of the first sub-display area and an area of the second sub-display area are equal.

In one embodiment, in the display device, a length of the first sub-display area is less than a length of the second sub-display area, and a width of the first sub-display area is greater than a width of the second sub-display area.

In one embodiment, in the display device, the main display area includes a first side in contact with the first sub-display area in the first direction and a second side in contact with the second sub-display area in the second direction, the first side and the second side meet and form a corner, and a shape of the corner is a rectilinear angle.

In one embodiment, in the display device, a shape of the first sub-display area and the second sub-display area is trapezoid-like, two sides of the first sub-display area and the second sub-display area are an arc, and an area of the first sub-display area and the second sub-display area is equal.

In one embodiment, in the display device, a width of the first sub-display area in the first direction is less than a width of the second sub-display area in the second direction.

In one embodiment, in the display device, in a vertical projection direction, a thickness of the display panel at the first sub-display area is equal to a thickness of the display panel at the second sub-display area.

In one embodiment, in the display device, a range of a bending angle of the first sub-display area of the display panel is 45 degrees to 90 degrees, and a range of a bending angle of the second sub-display area of the display panel is 45 degrees to 90 degrees.

In one embodiment, in the display device, a curvature of the display panel at the first sub-display area is equal to a curvature of the display panel at the second sub-display area.

It can be seen according to the above-described embodiments that:

The present application provides a display panel and a display device. The display panel includes a main display area, a sub-display area, and a terminal area. The sub-display area is disposed around the main display area, and the terminal area is disposed on one side of the sub-display area away from the main display area. Wherein, the sub-display area includes a first sub-display area and a second sub-display area adjacent to the main display area in a first direction and a second direction, respectively, the first direction is different from the second direction, and a difference between an area of the first sub-display area and an area of the second sub-display area is less than or equal to a preset value. In the present application, through setting an area difference between the first sub-display area and the second sub-display area in two directions of the display panel to be less than or equal to a preset value, an area difference between a force-receiving area of the first sub-display area and a force-receiving area of the second sub-display area will be less than or equal to a preset value such that force exerted on the first sub-display area and the second sub-display area is uniform, preventing concentrated force on one side of the display panel that leads to display panel breaking, and increasing yields of the display panel.

In the above-described embodiments, description of various embodiments has their own emphases, and contents not described in detail in one embodiment can be referred to related description in other embodiments.

Although the present application has been explained in relation to its preferred embodiment, it does not intend to limit the present application. It will be apparent to those skilled in the art having regard to this present application that other modifications of the exemplary embodiments beyond these embodiments specifically described here may be made without departing from the spirit of the application. Accordingly, such modifications are considered within the scope of the application as limited solely by the appended claims.

What is claimed is:

1. A display panel, comprising:
   a main display area;
   a sub-display area disposed around the main display area; and
   a terminal area disposed on one side of the sub-display area away from the main display area;
   wherein the sub-display area comprises a first sub-display area and a second sub-display area adjacent to the main display area in a first direction and a second direction, respectively, the first direction is different from the second direction, and a difference between an area of the first sub-display area and an area of the second sub-display area is less than or equal to a preset value;
   wherein the display panel further comprises:
   a substrate;
   a driving circuit layer disposed on one side of the substrate;
   a luminous functional layer disposed on one side of the driving circuit layer away from the substrate;
   an encapsulation layer disposed on one side of the luminous functional layer away from the driving circuit layer;
   a polarizer disposed on one side of the encapsulation layer away from the luminous functional layer;
   a cover plate disposed on one side of the polarizer away from the encapsulation layer, and a surface area of the cover plate is greater than a surface area of the polarizer; and
   an optical adhesive disposed between the polarizer and the cover plate, the optical adhesive comprises a first optical adhesive part disposed at the first sub-display area and a second optical adhesive part disposed at the second sub-display area, and a difference between an area of the first optical adhesive part and an area of the second optical adhesive part is greater than the preset value.

2. The display panel as claimed in claim 1, wherein the main display area comprises a first side in contact with the first sub-display area in the first direction and a second side in contact with the second sub-display area in the second direction, the first side and the second side meet and form a corner, and a shape of the corner is an arc.

3. The display panel as claimed in claim 2, wherein in a plane projection, a shape of the first sub-display area and a shape of the second sub-display area are rectangular, and the area of the first sub-display area and the area of the second sub-display area are equal.

4. The display panel as claimed in claim 3, wherein a length of the first sub-display area is less than a length of the second sub-display area, and a width of the first sub-display area is greater than a width of the second sub-display area.

5. The display panel as claimed in claim 1, wherein the main display area comprises a first side in contact with the first sub-display area in the first direction and a second side in contact with the second sub-display area in the second direction, the first side and the second side meet and form a corner, and a shape of the corner is a rectilinear angle.

6. The display panel as claimed in claim 5, wherein a shape of the first sub-display area and a shape of the second sub-display area are trapezoid-like, two lateral sides of the first sub-display area and two lateral sides of the second sub-display area are an arc, and the area of the first sub-display area and the area of the second sub-display area are equal.

7. The display panel as claimed in claim 6, wherein a width of the first sub-display area in the first direction is less than a width of the second sub-display area in the second direction.

8. The display panel as claimed in claim 1, wherein in a vertical projection direction, a thickness of the display panel at the first sub-display area is equal to a thickness of the display panel at the second sub-display area.

9. The display panel as claimed in claim 1, wherein a range of a bending angle of the first sub-display area of the display panel is 45 degrees to 90 degrees, and a range of a bending angle of the second sub-display area of the display panel is 45 degrees to 90 degrees.

10. The display panel as claimed in claim 9, wherein a curvature of the display panel at the first sub-display area is equal to a curvature of the display panel at the second sub-display area.

11. The display panel as claimed in claim 1, wherein the polarizer comprises a first polarizer part disposed at the first sub-display area and a second polarizer part disposed at the second sub-display area, and a difference between an area of the first polarizer part and an area of the second polarizer part is less than or equal to the preset value.

12. The display panel as claimed in claim 11, wherein the display panel further comprises a backplate, the backplate is disposed on the one side of the substrate away from the driving circuit layer, the backplate comprises a first backplate part disposed at the first sub-display area and a second backplate part disposed at the second sub-display area, and a difference between an area of the first backplate part and an area of the second backplate part is less than or equal to the preset value.

13. A display device, comprising:
a display panel comprising a main display area, a sub-display area, and a terminal area, wherein the sub-display area is disposed around the main display area, and the terminal area is disposed on one side of the sub-display area away from the main display area, and wherein the sub-display area comprises a first sub-display area and a second sub-display area adjacent to the main display area in a first direction and a second direction, respectively, the first direction is different from the second direction, and a difference between an area of the first sub-display area and an area of the second sub-display area is less than or equal to a preset value;
wherein the display panel further comprises:
a substrate;
a driving circuit layer disposed on one side of the substrate;
a luminous functional layer disposed on one side of the driving circuit layer away from the substrate;
an encapsulation layer disposed on one side of the luminous functional layer away from the driving circuit layer;
a polarizer disposed on one side of the encapsulation layer away from the luminous functional layer;
a cover plate disposed on one side of the polarizer away from the encapsulation layer, and a surface area of the cover plate is greater than a surface area of the polarizer; and
an optical adhesive disposed between the polarizer and the cover plate, the optical adhesive comprises a first optical adhesive part disposed at the first sub-display area and a second optical adhesive part disposed at the second sub-display area, and a difference between an area of the first optical adhesive part and an area of the second optical adhesive part is greater than the preset value.

14. The display device as claimed in claim 13, wherein the main display area comprises a first side in contact with the first sub-display area in the first direction and a second side in contact with the second sub-display area in the second direction, the first side and the second side meet and form a corner, and a shape of the corner is an arc.

15. The display panel as claimed in claim 14, wherein in a plane projection, a shape of the first sub-display area and a shape of the second sub-display area are rectangular, and the area of the first sub-display area and the area of the second sub-display area are equal.

16. The display device as claimed in claim 15, wherein a length of the first sub-display area is less than a length of the second sub-display area, and a width of the first sub-display area is greater than a width of the second sub-display area.

17. The display device as claimed in claim 13, wherein the main display area comprises a first side in contact with the first sub-display area in the first direction and a second side in contact with the second sub-display area in the second direction, the first side and the second side meet and form a corner, and a shape of the corner is a rectilinear angle.

18. The display panel as claimed in claim 17, wherein a shape of the first sub-display area and a shape of the second sub-display area are trapezoid-like, two lateral sides of the first sub-display area and two lateral sides of the second sub-display area are an arc, and the area of the first sub-display area and the area of the second sub-display area are equal.

19. The display device as claimed in claim 18, wherein a width of the first sub-display area in the first direction is less than a width of the second sub-display area in the second direction.

* * * * *